(12) United States Patent
Zehetbauer

(10) Patent No.: US 10,256,803 B2
(45) Date of Patent: Apr. 9, 2019

(54) ELECTRICAL DEVICE WITH A PULSED POWER SUPPLY AND METHOD FOR EXAMINING THE POWER SUPPLY OF THE ELECTRICAL DEVICE

(71) Applicant: KUKA Deutschland GmbH, Augsburg (DE)

(72) Inventor: Sebastian Zehetbauer, Munich (DE)

(73) Assignee: KUKA Deutschland GmbH, Augsburg (DE)

( * ) Notice: Subject to any disclaimer, the term of this patent is extended or adjusted under 35 U.S.C. 154(b) by 74 days.

(21) Appl. No.: 15/437,705

(22) Filed: Feb. 21, 2017

(65) Prior Publication Data

US 2017/0257089 A1 Sep. 7, 2017

(30) Foreign Application Priority Data

Mar. 1, 2016 (DE) ........................ 10 2016 203 355

(51) Int. Cl.
| | |
|---|---|
| *H03K 17/0814* | (2006.01) |
| *H02M 1/32* | (2007.01) |
| *H02M 3/335* | (2006.01) |
| *G01R 31/42* | (2006.01) |
| *H02K 11/33* | (2016.01) |

(52) U.S. Cl.
CPC ......... *H03K 17/0814* (2013.01); *G01R 31/42* (2013.01); *H02M 1/32* (2013.01); *H02M 3/335* (2013.01); *H02K 11/33* (2016.01)

(58) Field of Classification Search
CPC ..... H03K 17/0814; G01R 31/42; H02M 1/32; H02M 3/335; H02K 11/33

(Continued)

(56) References Cited

U.S. PATENT DOCUMENTS 9,817,057 B2 11/2017 Langhans et al.
2007/0091527 A1 4/2007 Julicher
(Continued)

FOREIGN PATENT DOCUMENTS

CN 101292209 A 10/2008
CN 102386799 A 3/2012
(Continued)

OTHER PUBLICATIONS

Korean Patent Office; Office Action in related Korean Patent Application No. 10-2017-0026452 dated Dec. 20, 2017; 7 pages.
(Continued)

Primary Examiner — Carlos D Amaya
(74) Attorney, Agent, or Firm — Dorton & Willis, LLP

(57) ABSTRACT

An electrical device includes an electrical load, an electronic switch with an electronic switching element and a driver controlling the electronic switching element, and at least one pulsed power supply having a power unit coupled with the electronic switching element and configured to generate an electrical supply current for the electrical load from a voltage based on alternately turning on and off the electronic switching element. During operation of the power supply, an electrical current associated with the electronic switching element flows through a current path. A pulse transformer has a primary side coupled with the power unit such that the electrical current flows through a primary-side winding. A comparator compares a secondary-side electrical voltage or a filtered secondary-side electrical voltage of the transformer, and an evaluation device coupled with the comparator detects potential defects of the electronic switch based on the result of the comparison.

11 Claims, 3 Drawing Sheets

(58) Field of Classification Search
USPC .......................................................... 307/130
See application file for complete search history.

(56) References Cited

U.S. PATENT DOCUMENTS

| | | | |
|---|---|---|---|
| 2011/0309145 A1 | 12/2011 | Richardson et al. | |
| 2012/0051099 A1 | 3/2012 | Funaba et al. | |
| 2014/0111244 A1 | 4/2014 | Langhans et al. | |
| 2014/0362480 A1* | 12/2014 | Veil .................. | B25J 9/1674 361/18 |

FOREIGN PATENT DOCUMENTS

| | | |
|---|---|---|
| CN | 102426474 A | 4/2012 |
| CN | 103777128 A | 5/2014 |
| DE | 102012219318 A1 | 4/2014 |
| JP | 2006280100 A | 10/2006 |
| KP | 1020140052868 A | 5/2014 |
| WO | 00/33095 A1 | 6/2000 |

OTHER PUBLICATIONS

German Patent Office; Office Action in German Patent Application No. 10 2016 203 355.7 dated Oct. 20, 2016; 9 pages.
European Patent Office; Search Report in European Patent Application No. 17156022.0 dated Jul. 5, 2017; 9 pages.
Chinese Patent Office; Office Action in related Chinese Patent Application No. 201710116818.3 dated Nov. 27, 2018; 6 pages.
Chinese Patent Office; Search Report in related Chinese Patent Application No. 201710116818.3 dated Nov. 16, 2018; 2 pages.

* cited by examiner

ELECTRICAL DEVICE WITH A PULSED POWER SUPPLY AND METHOD FOR EXAMINING THE POWER SUPPLY OF THE ELECTRICAL DEVICE

CROSS-REFERENCE TO RELATED APPLICATIONS

This application claims the benefit of priority under 35 U.S.C. § 119(a) to German Patent Application DE 10 2016 203 355.7, filed Mar. 1, 2016 (pending), the disclosure of which is hereby incorporated by reference in its entirety.

TECHNICAL FIELD

The invention relates to an electrical device, in particular an electrical machine having a pulsed power supply and a method for testing the power supply of the electrical device.

BACKGROUND

DE 10 2012 219 318 A1 discloses an electrical device, in particular an electrical machine, having an electrical load, a pulsed power supply, at least an pulse transformer and an evaluation device. The power supply comprises a power unit, having at least a power semiconductor switch, and is adapted to generate a pulsed electrical voltage for the electric load from an electrical voltage based on an alternate turning on and off of the at least one power semiconductor switch. The power unit has at least one current path, through which flows an electrical current during operation of the power supply. The evaluation device is adapted to evaluate a signal originating from the pulse transformer and to determine the functionality of the power semiconductor switch based on the evaluated signal.

SUMMARY

It is the object of the invention to state an improved possibility to monitor an electronic switch of an electronic device during ongoing operation of the electrical device in an improved manner.

The object of the invention is solved by means of an electrical device, comprising an electrical load, an electronic switch, comprising an electronic switching element and a driver device controlling the electronic switching element, a pulsed power supply, having a power unit with the electronic switch element and being adapted to generate an electrical supply voltage or an electrical supply current for the electric load from an electrical voltage based on an alternate turning on and off of the one electronic switching element, the power unit having a current path, through which flows an electrical current during operation of the power supply, which current is associated to the electronic switching element of the electronic switch, at least one pulse transformer, having a primary side with a primary-side winding, and a secondary side with a secondary-side winding, and which is connected into the power unit with its primary-side in such way that the electrical current, which is associated to the electronic switching element of the electronic switch, flows through the primary-side winding, the pulse transformer being lightly loaded on its secondary-side to such extent that the secondary-side electrical voltage across the secondary-side winding is at least approximately proportional to the rate of change of the electrical current, which is associated to the electronic switching element of the electronic switch, a threshold value decider, which is adapted to compare the secondary-side electrical voltage or a filtered secondary-side electrical voltage, which is generated by filtering of the secondary-side electrical voltage, with a reference voltage, which is associated in particular to a rate of change of an electrical current, which change is associated to the fully functioning electronic switch, and an evaluation device coupled to the threshold value decider, which device is adapted to detect a potential defect of the electronic switch based on the comparison implemented with the threshold value decider.

The object is also solved by a method for examining the power supply of the inventive electrical device, comprising the following method steps:

alternate opening and closing of the electronic switching element, comparing the secondary-side electrical voltage or the filtered secondary-side electrical voltage with the reference voltage, and determining a potential defect of the electronic switch based on the comparison.

The inventive device is, for example, an electrical machine, such as, e.g., a robot, and comprises the pulsed power supply, which is provided to supply the electrical load of the inventive device with the electrical supply voltage or the electrical supply current. The electrical supply voltage, in particular, is a voltage regulated by means of timing, and the electrical supply current, in particular, is an electrical current regulated by means of timing, respectively.

The electrical load, in particular, is an inductive load, preferably an electromechanical brake.

The inductive load, for example, can also be a relay or the primary winding of a power transformer or of a power inductance for an optional switched-mode power supply or a motor in connection with a multiphase bridge circuit (frequency converter). Electromechanical brakes are used, e.g., for robots, to stop one of the links of its robot arms, in particular in an emergency situation. Robots generally comprise a robot arm and a control device. The robot arm has several links, arranged one after another and connected via joints, and electrical motors to move the links in respect to one another.

The inventive device comprises the electronic switch, which comprises the electronic switching element and the driver device, which controls the electronic switching element. The electronic switch is preferably a semi-conductor switch. In this case, the electronic switching element is designed as a transistor. The transistor, in particular, is a power transistor.

The pulsed power supply comprises the power unit, which is designed as an H-bride, for example. The power unit comprises the switching element of the electronic switch. The power unit is provided to generate the supply voltage or the supply current for the electrical load from an electrical voltage based on, e.g., an alternate turning on and off of the electronic switching element.

The power unit is configured as an inverter, for example.

During operation of the power supply or the inventive electrical device, the electronic switching element, in particular, which is controlled by the driver device, is alternately closed and opened. In doing so, the power supply comprises, e.g., suitable control electronics, as known in principle to the person skilled in the art. The control electronics controls the driver devices of the electrical switch such that the electronic switching element opens and closes, accordingly.

The pulse transformer is provided to be able to examine the functionality of the electronic switch during ongoing operation of the electrical device or its power supply, to be able to detect, in particular, an initiating or potential defect of the driver of the electronic switch, as soon as possible.

Pulse transformers as such are known to the person skilled in the art. They comprise a primary side having the primary-side winding. The primary-side winding is associated to a primary-side inductance L1 and the primary-side winding comprises n1 windings. Pulse transformers also have a secondary side, having a secondary-side winding. The secondary-side winding is associated to a secondary-side inductance L2, and the secondary-side winding comprises n2 windings. Thus, pulse transformers have a transmission ratio primary side to secondary side of n1:n2 or a transmission ratio secondary-side to primary-side of n2:n1.

The pulse transformer is interconnected with the power unit on the primary side such that electrical current, which is associated to the electronic switching element, flows through the primary-side winding.

The electronic switch can be part of the current path, for example, through which the electrical current, which is associated to the electronic switching element, flows during operation. In this case, the electric current, which also flows through the electronic switching element, flows through the primary-side winding of the pulse transformer.

Furthermore, the inventive pulse transformer is lightly loaded on its secondary side to such extent, that the secondary-side electrical voltage, which is applied to the secondary-side winding of the pulse transformer, is at least approximately proportional to the rate of change of the electronic current, which is associated to the electronic switching element of electronic switch.

Pulse transformers have, e.g., a transmission ratio n1:n2 of 1:20 . . . 1:100. However, the inventive pulse transformer is not operated, as commonly practiced, as transformer with a defined passive load resistor on the secondary side, having the common wiring as a current transformer, but rather on the secondary side having a lightly loaded output to such extent that the primary side (input side) of the pulse transformer functions like an inductor (unloaded transformer), in contrast to the wiring as an energy-transforming transformer, on which inductor forms a primary-side electrical voltage, which is at least approximately proportional to the change of the primary-side electrical current. The primary-side electrical voltage is applied to the primary-side winding. As a result, the secondary-side electrical voltage, which is available for measurements, is created according to the transmission ratio of the pulse transformer on the secondary-side or output side of the pulse transformer.

This basic principle, however, can also be employed in applications having relatively high power (energy supply, electronic power frequency transformation, monitoring of, e.g., GTOs or IGBTs).

In particular, the following equations are used as the basis for the calculation of the quantitative evaluable changes in current velocity at the electronic switching element to be monitored.

The output voltage of the pulse transformer, i.e., the secondary-side electrical voltage U2, is constituted by the input voltage, i.e., the primary-side electrical voltage U1 of the pulse transformer, that is: $U2=n2/n1*U1$ The following relationship is valid for the primary-side electrical voltage U1 (input voltage) of the secondary-side unloaded pulse transformer $U1=L1*di/dt$ wherein di/dt is the rate of change of the electrical current, which flows through the primary side.

The combination of both expressions provides $U2=n2/n1*L1*di/dt$

This equation is valid for the pulse transformer of the inventive device, at least approximately, so that the secondary-side electrical voltage is at least approximately proportional to the rate of change of the electrical current, which is associated to the electronic switching element of the electronic switch.

The threshold value decider is provided, according to the invention, which decider recognizes—for the secondary-side electrical voltage, and which, in particular, in combination with the selected pulse transformer and its technical data in comparison to a preferably freely selectable reference voltage—if, in particular, an at least determined switching velocity is achieved in the current path. A signal is then available for further evaluation at an output of the threshold value decider. This signal is evaluated by the evaluation device.

The at least determined switching velocity in the current path can be necessary, e.g., in pulsed electronic power circuits, to guarantee an operation of the employed electronic power switches, which is relatively low in loss of power. If the switching velocity should become too slow, based on a defect in the driver circuit of the electronic circuit breaker or the electronic circuit breaker itself, an increased loss of switching power is to be expected and an increased and possibly destructive temperature could occur.

By monitoring the switching velocity, a signalizing defect can be recognized and treated before consequential errors or far reaching component—or assembly—cases manifest.

For example, a single pulse transformer in combination with two output-side threshold value deciders can be used, to monitor both a power-on process (increasing change in current di/dt>0) and a power-off process (decreasing change in current di/dt<0) of the electronic switch. This may facilitate a relatively differentiated diagnosis of the monitored electronic switch, where applicable.

As a consequence, this results, in particular, in a monitoring of the switching velocity of the electronic switch.

The threshold value decider is, e.g., an operational amplifier, a comparator, or a bipolar transistor.

Further, with the knowledge of the switching velocity to be evaluated, robustness can be provided with the help of a filter, in particular a secondary-side low-pass filter, against, e.g., transient coupled interference. On the one hand, the design of the pulse transformer allows for the evaluation of a minimal current increase velocity, on the other hand, the filter dampens particularly fast and short occurrences. In doing so, the robustness of the evaluation device can be improved relative to the coupled interference impulses.

Pursuant to a variation of the electrical device, said device preferably has a low-pass filter, which is downstream of the secondary-side pulse transformer, which device is configured to generate the filtered secondary-side electrical voltage from the secondary-side electrical voltage.

Pursuant to one embodiment of the electrical device, the evaluation device can be configured to recognize a potential defect of the electronic switch based on the comparison implemented by the threshold value decider for a power-on or power-off process of the electronic switching element. In case of the potential defect, the electronic switch switches slower than provided, e.g., based on a possible error in the electronic switch element itself or in its driver device.

Preferably, the threshold value decider generates an output signal, which changes, as soon as the secondary-side electrical voltage or the filtered secondary-side electrical voltage exceeds the reference voltage.

The evaluation device is preferably configured to determine a potential defect of the electronic switch, if—despite of a power-on or power-off process of the electronic switch—the secondary-side electrical voltage or the filtered secondary-side electrical voltage always falls below the reference voltage.

As a consequence, the inventive method can have the following method steps: Determining a potential defect of the electronic switch, if—despite of a power-on or power-off process of the electronic switch—the secondary-side electrical voltage or the filtered secondary-side electrical voltage always falls below the reference voltage.

BRIEF DESCRIPTION OF THE DRAWINGS

Other features and advantages of the invention will become apparent from the following description of embodiments of the invention which are in no way limitative, and the attached drawings, in which.

DETAILED DESCRIPTION

Figure 1:
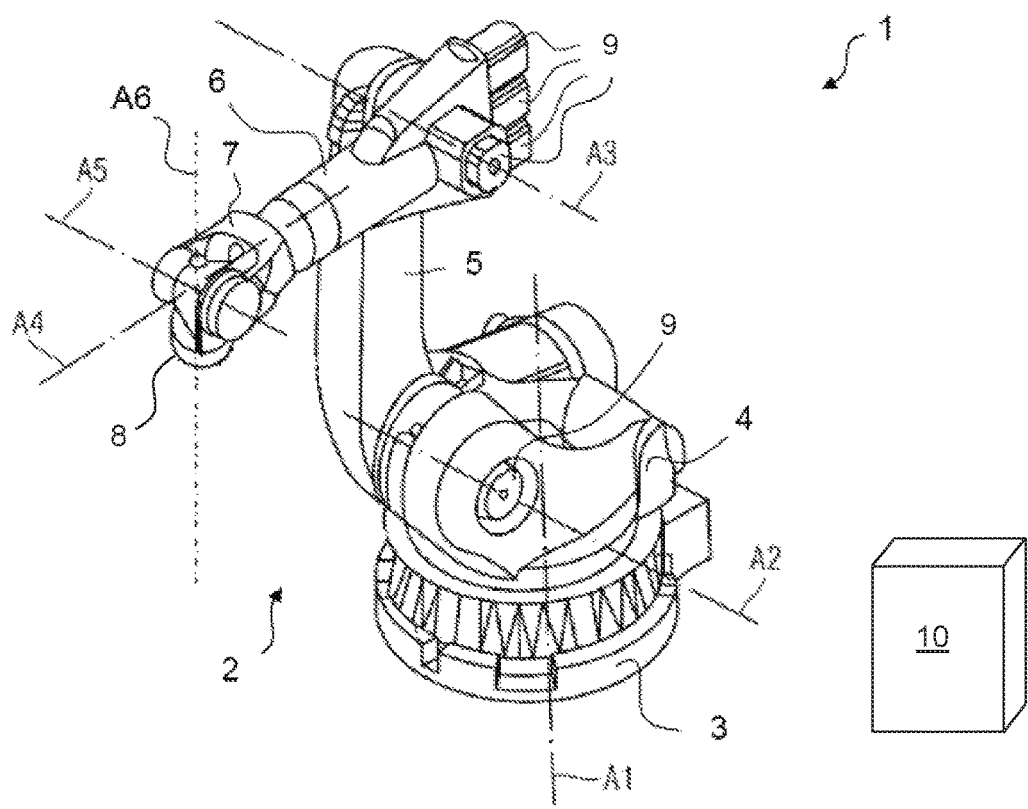
FIG. 1 depicts a robot having a robot arm in a perspective representation.

FIG. 1 depicts a robot 1 having a robot arm 2 in a perspective representation.

In case of the present embodiment examples, said robot arm 2 comprises several links, arranged one after the other and connected by joints. The links in question, in particular, are a stationary or movable stand 3 and a carousel 4, which is rotatably mounted around a vertical axis A1 relative to stand 3. Further links of the robot arm 2, in case of the present exemplary embodiment, are a link arm 5, a boom arm 6 and a preferably multi-axis robot hand 7 having an attachment device, e.g., configured as flange 8 for attaching an end-effector, which is not represented in more detail. The link arm 5 is pivotally mounted at the bottom end, e.g., at a link pivot bearing head on the carousel 4, which is not represented in more detail, around a preferably horizontal axis A2. At the upper end of the link arm 5, the boom arm 6 is pivotally mounted around a likewise preferably horizontal axis A3. This boot arm carries the robot hand 7, with its preferably three axes A4, A5, A6, on its end side.

To be able to move the robot 1 or its robot arm 2, this arm comprises electrical drivers, which are connected to a control device 10 in the generally known way. FIG. 1 depicts only some of the electrical motors 9 of these electrical drivers, which are attached in or at the robot arm 2. Power electronics of the electrical drivers are arranged, e.g., inside a housing of a control cabinet, which is not represented in more detail, within which, e.g., the control device 10 is also arranged. The electrical motors 9, in the case of the present exemplary embodiment, are three-phase motors, for example three-phase synchronous motors. The power electronics, however, can also be arranged in and/or at the robot arm 2.

The power electronics, in case of the present exemplary embodiment, as it is known in principle to the person skilled in the art, comprises a rectifier, which is not represented in more detail, which generates DC voltage from the power supply, an intermediate circuit downstream of the rectifier, likewise having an intermediate capacitor, which is likewise not represented in more detail, for smoothing of the DC voltage, and several converters or inverters downstream of the intermediate capacitor.

A computer program is executed on the control device 10, which is configured, e.g., as a computer, by means of which—during operation of robot 1—the control device 10 controls said robot such that, e.g., flange 8 or a so called tool center point executes a predetermined movement. The control device 10 controls the electrical drivers, where applicable, as this is known in principle to the person skilled in the art. Where applicable, the electrical drivers are controlled electrical drivers, and the control device 10 generates desired signals for the controlled electrical drivers or their inverters.

Figure 2:
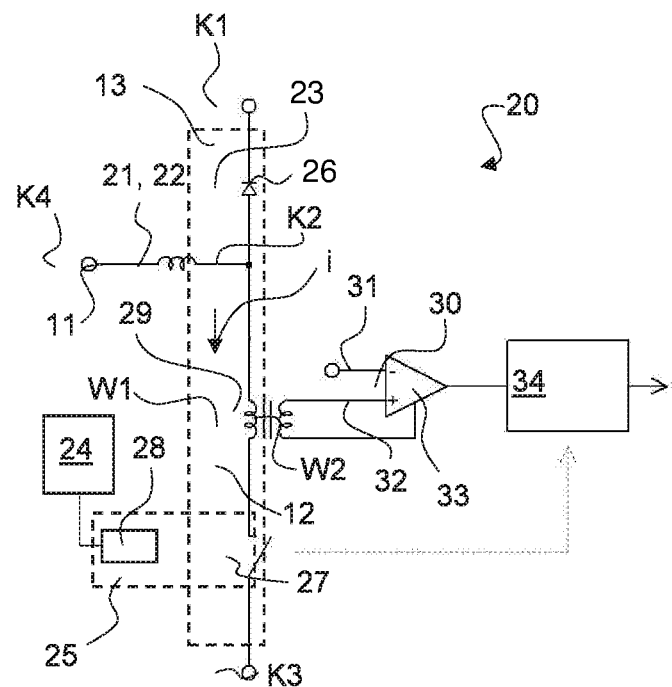
FIG. 2 depicts a principle circuit diagram.

In case of the present exemplary embodiment, said robot 1 comprises electromechanical brakes to stop the individual links. They are configured such that they are held in the disengaged state by means of an inductor biased with an electrical current. If the inductor is turned off, the brake triggers automatically and stops the link of robot arm 2, which is associated to it. In doing so, the brakes comprise, for example, biased springs. FIG. 2 depicts, for example, the inductor 21 of the brake provided for stopping the carousel 4.

To be able to hold the brake in its disengaged state or to move it from its engaged into its disengaged state, during the operation of said robot 1, said robot 1 comprises pulsed power supplies, which are associated to the brakes, in case of the present exemplary embodiment.

FIG. 2 partially depicts a circuit diagram of the pulsed power supply 20, which is associated to the brake of carousel 4. The inductor 21 thus represents an electrical load, in particular an inductive load 22, for the power supply 20.

In case of the present exemplary embodiment, the power supply 20 comprises a power unit 23 and its controlling electronics 24, which is adapted to control the power unit 23. The control electronics 24 is, e.g., part of the control device 10.

The power supply partially depicted in FIG. 2 is, e.g., configured such that its power unit 23 is configured as an only partially represented H-bridge. H-bridges as such are known in principle to the person skilled in the art.

In case of the present exemplary embodiment, the power unit 23 of the power supply 20 comprises several electrical paths, through which flow electrical currents during operation of the power supply 20.

In the case of the present exemplary embodiment, the power supply 20 comprises at least an electronic switch 25. The electronic switch 25, in particular, is configured as a semi-conductor switch, preferably as a power semiconductor switch, and comprises an electronic switching element and a driver device, 28, which controls the electronic switching element. The electronic switching element, for example, is a transistor 27. The transistor 27 can be configured in FET technology. It can also be a bipolar transistor.

In the case of the present exemplary embodiment, the power unit 23 comprises the transistor 27, generally the electronic switching element, and a flyback diode 26.

The power unit 23, e.g., is supplied by an electrical supply voltage, which is, in particular, an electrical DC voltage, and is applied to a first node K1. Such voltage, e.g., is generated from the power voltage by means of rectification and subsequent smoothing.

In the case of the present exemplary embodiment, the topology of the power unit 23 is as follows:

The flyback diode 26 is connected to the first node K1, on the one hand, and to a second node K2 in reverse direction, on the other hand. The transistor 27 is connected to the second node K2, and to a third node K3, on the one hand. The third node K3, e.g., is connected to a reference potential, e.g., with ground.

The inductor 21 of the brake is connected between the second node K2 and a forth node K4.

The inductor 21 is part of a first current path 11, the transistor 27 is part of a second current path 12, and the flyback diode 26 is part of a third current path 13.

In the case of the present exemplary embodiment, the transistor 27 is alternately turned on and off during an operation, in which, i.e., the brake is disengaged and thus does not stop its relevant link. In particular, this transistor is turned on and off by means of a pulse-width modulated signal.

In the case of the present exemplary embodiment, it is provided to bias the brakes in their disengaged state with an electrical current by means of the power supply 20. As a result, the electronic switch 25 or its electronic switching element, which is designed as a transistor, is turned on and off in a suitable way by means of the control electronics 24, which generates the pulse width modulated signal. In doing so, the control electronics 24 controls the driver device 28 of the electronic switch 25 in a manner known in principle to the person skilled in the art.

Based on the controlling of the electronic switch 25 or its driver device 28, the electronic switching element, which is configured as transistor 27, is switched back and forth alternately between its conductive or low-ohmic state and its blocking or high-ohmic state, according to the pulse width modulated signal.

As already described, the brake disengages if electric current no longer permanently flows through its inductor 21. This is achieved in that the electronic switch 25 or its electronic switching element, which is configured as a transistor 27, remains permanently opened or permanently in its blocked state.

To be able to examine the functionality of the electronic switch 25 during current operation or normal operation of the robot 1, as well, i.e., to examine the functionality of the electronic switch 25 even with the brake being disengaged, the robot 1, in the case of the present exemplary embodiment, comprises an pulse transformer 29.

The pulse transformer 29 comprises a primary side having a primary-side winding W2, which is associated to a primary-side inductance L1, and which comprises the n1 windings. The pulse transformer 29 comprises (sic: text missing in source text) and a secondary side having a secondary-side winding W2, which is associated to a secondary-side inductance L2 and which comprises the n2 windings. The pulse transformer 29 has a transmission ratio of n1:n2 (primary side/secondary side).

In the case of the present exemplary embodiment, the pulse transformer 29 is connected in series with the electronic switching element, which is configured as transistor 27, so that the electrical current of the second current path 12 flows through the primary-side winding W1 and through the switching element 27.

The pulse transformer 29 is lightly loaded secondary-side such that at least the following is approximately valid:

$$U2 = n2:n1 * U1 = n2:n1 * L1 * di/dt$$

wherein U1 is the primary-side electrical voltage of the pulse transformer 29, which is applied to the primary-side winding W1, and U2 is the secondary-side electrical voltage of the pulse transformer 29, which is applied to the secondary-side winding W2.

As a consequence, the secondary-side electrical voltage U2 is at least approximately proportional to the rate of change of the electrical current i, which flows through the electronic switching element, which is configured as transistor 27.

In the case of the present exemplary embodiment, the power supply 20 comprises a threshold value decider 30, which is configured, e.g., as operational amplifier.

The threshold value decider 30 comprises, e.g., a first input 31 and a second input 32, to which the secondary-side voltage U2 is applied. A reference voltage $U_{ref}$ is applied at the first input 31 as reference signal. The reference signal can be adjusted statically or, if required, dynamically during current operation.

The threshold value decider 30 comprises an output 33, at which an output signal is applied. Two logical values are associated thereto, i.e., the output signal has a first value, as long as the secondary-side electrical voltage U2, which is applied at its second input 32, is less than the reference voltage $U_{ref}$. If the secondary-side electrical voltage U2, which is applied at the second input 32, is higher than the reference voltage $U_{ref}$, then the output signal has a second value, which differs from the first value.

As already explained, $$U2 = n2:n1 * L1 * di/dt$$

is valid, at least approximately.

In the case of the present exemplary embodiment, the reference voltage $U_{ref}$ or the reference signal is selected such that the output signal takes on its second value if the rate of change of the current i exceeds a predetermined value by means of transistor 27. This predetermined value is associated to the electronic switch 25, which is fully functional. If the electrical current i changes too slow during switching, then the secondary-side electrical voltage U2 does not exceed the reference voltage $U_{ref}$, whereupon an initiating defect of the electronic switch 25 can be determined.

The output signal can then be evaluated by the evaluation device 34. The evaluation device 34 can be part of the control device 10.

It can also be provided that the pulse transformer 29 is connected in series with the flyback diode 26, so that the rate of change of the electrical current is analyzed by the flyback diode 26. Likewise, this electrical current is an electrical current, which is associated to the electronic switching element 25.

Having knowledge of the switching points of the transistor 27, the evaluation device 34 can recognize an initiating defect of the electronic switch 25 relatively quickly, and, with, e.g., a suitable configuration, significantly faster than within 200 ns.

The polarity of the pulse transformer 29, its arrangement at the transistor 27 or at the flyback diode 26, and the type of its connection to the threshold value decider 30 can be freely selected and facilitate evaluation of either the beginning of the power-on process (magnetizing of the load inductance, begin of the current flow in a resistive or capacitive load) or the beginning of the power-off process (de-magnetizing, freewheel, power-off of another load).

Figure 3:
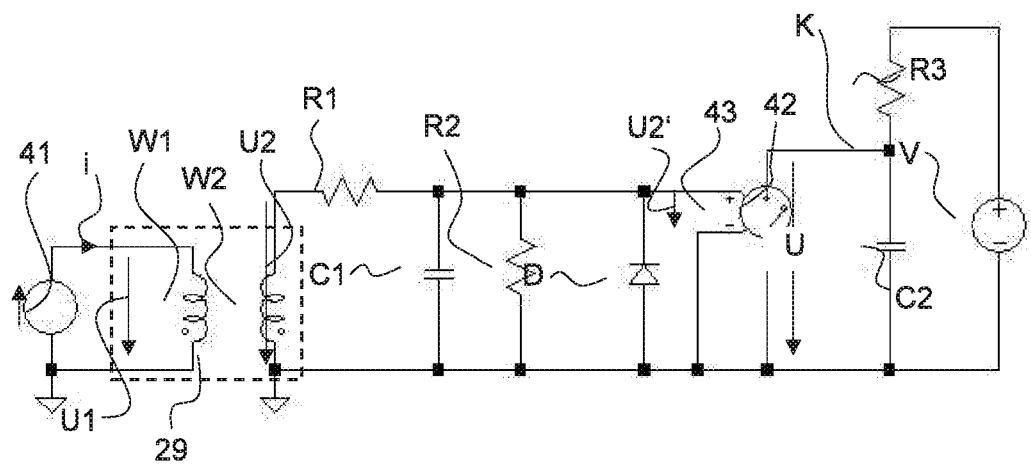
FIG. 3 is a circuit diagram of an electrical circuit.

FIG. 3 depicts an embodiment in the form of a computer simulation. In doing so, the electronic switch 25 or its electronic switching element is simulated as connectable current source 41, so that the electrical current of the current source 41 simulates the electrical current i by means of the transistor 27, generally by means of the electronic switching element 27.

The values of the pulse transformer 29 for the computer simulation are as follows:

L1=200 nF
L2=80 µF
n1=1
n2=20

In the case of the circuit diagram of the computer simulation depicted in FIG. 3, the pulse transformer 29 is wired to a low-pass filter on the secondary side, which has a first resistance R1, a first capacitor C1, and a second resistance R2, which is connected in parallel to the first capacitor C1. The values of these components are as follows:

R1=100Ω
R2=10 kΩ
C1=1 nF

A threshold value decider 42 is downstream to the low-pass filter, at the input 43 of which an electrical voltage is applied. In the case of the present exemplary embodiment, a diode D is connected in parallel to the second resistance R2 and the first capacitor C1 in such way that only positive electrical voltage can be applied to the inputs 43.

The electrical voltage, which is applied at the input 43 of the threshold value decider 42, in consequence, is a secondary-side electrical voltage U2' of the pulse transformer 29, filtered by means of the low-pass filter, wherein negative voltage values are filtered out by the diode D.

In the case of the present exemplary embodiment, the threshold value decider 42 is a controlled switch, which closes as soon as the electrical voltage applied at its input 43 is higher or equal to a reference voltage. In the case of the present exemplary embodiment, the reference voltage is 1.0V, so that the switch closes as soon as the filtered secondary-side electrical voltage U2' is higher or equal to 1.0V, and opens again, if the filtered secondary-side electrical voltage U2' is less than 1.0V.

The threshold decider 42 is, e.g., a bipolar transistor and has an output voltage U.

The circuit of FIG. 3 comprises another third resistor R3 (220Ω) and a second capacitor C2 (10 nF), which are connected with one of their terminals to a node K, respectively. The other terminal of the second capacitor C2 is connected to ground.

Further provided is a voltage source V, which generates a DC voltage of 1.0V. The voltage source V is connected to ground, on the one hand, and to the third resistance R3, on the other hand.

The switch of the threshold value decider 42 is connected to the node K and to ground.

Because the switch of the threshold value decider 42 is open, if the filtered secondary-side electrical voltage U2' at its input 43 is less than 1.0V, the output voltage U is equal to 1.0V, as long as the filtered secondary-side electrical voltage U2' at its input 43 is less than 1.0V. If the filtered secondary-side electrical voltage U2' at input 43 is higher or equal to 1.0V, then the switch of the threshold value decider 42 closes and the output voltage U becomes zero.

Figure 4:
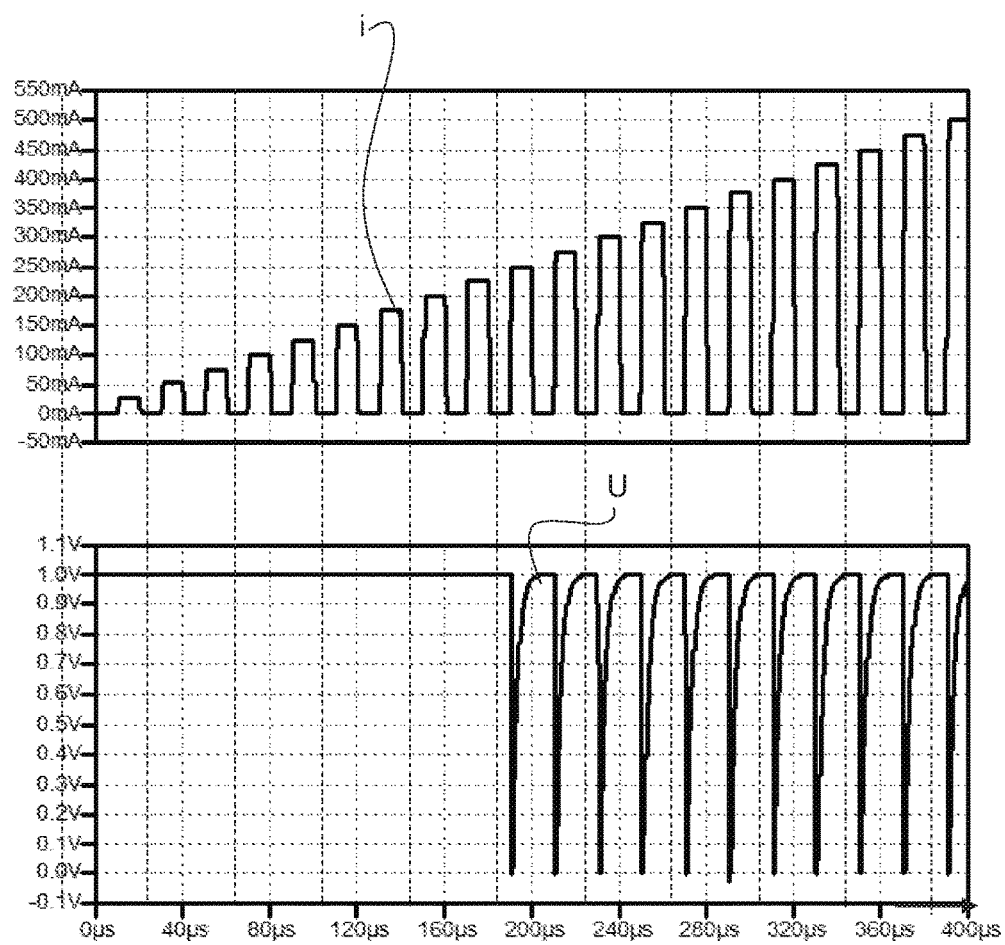
FIG. 4 illustrates simulation results for the electrical circuit of FIG. 3.

To be able to test the circuit of FIG. 3, the current source 41 generates impulses different in height of the electrical current i (current impulses), which are depicted in FIG. 4. The increase and decrease times of the current impulses are always 1 µs, so that impulses with a current change rate di/dt having different heights are created from the different impulse heights and the always same increase and decrease time, for proof of the functional principle.

The current impulses are sent through the primary side of the pulse transformer 29. The ratio of the two inductances L1 and L2 (1:400) corresponds to a winding number ratio or a transfer ratio of 1:20.

The secondary-side electrical voltage U2 of the pulse transformer 29 is filtered and limited by the low-pass filter and the diode D, without, however, putting a noteworthy load on the output of the pulse transformer 29, i.e. secondary-side, and without changing the properties on the primary side of the pulse transformer 29 in a noticeable way.

Based on the values of the pulse transformer 29, it follows that beginning with a change of the electrical current i of 250 mA/µs, the decision threshold of 1.0 V is reached and an evaluable signal (output voltage U) is created.

FIG. 4 depicts, that beginning with a change of the electrical current i of di/dt=250 mA/µs in the primary-side winding W1 of the pulse transformer 29, an output signal U is created, which depicts a sufficiently fast change of current for the selected numerical example.

The current impulses depicted in FIG. 4 have a current change rate di/dt in the following heights:

25 mA/µs; 50 mA/µs; 75 mA/µs; 100 mA/µs; 125 mA/µs; 150 mA/µs; 175 mA/µs; 200 mA/µs; 225 mA/µs; 250 mA/µs; 275 mA/µs; 300 mA/µs; 325 mA/µs; 350 mA/µs; 375 mA/µs; 400 mA/µs; 425 mA/µs; 450 mA/µs; 475 mA/µs; 500 mA/µs;

The low-pass filter is able to dampen coupled interferences, which could cause an undesired triggering of the threshold value decider.

While the present invention has been illustrated by a description of various embodiments, and while these embodiments have been described in considerable detail, it is not intended to restrict or in any way limit the scope of the appended claims to such detail. The various features shown and described herein may be used alone or in any combination. Additional advantages and modifications will readily appear to those skilled in the art. The invention in its broader aspects is therefore not limited to the specific details, representative apparatus and method, and illustrative example shown and described. Accordingly, departures may be made from such details without departing from the spirit and scope of the general inventive concept.

What is claimed is:

1. An electrical device, comprising:
an electrical load;
an electronic switch including an electronic switching element and a driver device controlling the electronic switching element;
a pulsed power supply having a power unit operatively coupled with the electronic switching element and configured to generate an electrical supply voltage or an electrical supply current for the electrical load from an electrical voltage based on an alternate turning on and off of the electronic switching element, the power unit having a current path through which flows an electrical current associated with the electronic switching element of the electronic switch during operation of the power supply;
at least one pulse transformer having a primary side with a primary-side winding and at least one secondary side with at least one secondary-side winding,
the pulse transformer coupled with the power unit by primary side in such a way that the electrical current associated with the electronic switching element of the electronic switch flows through the primary-side winding, the pulse transformer being lightly loaded on the secondary side to such extent that a secondary-side electrical voltage across the secondary-side winding is at least approximately proportional to the rate of change of the electrical current associated with the electronic switching element of the electronic switch;

a comparator configured to compare the secondary-side electrical voltage or a filtered secondary-side electrical voltage that is generated by filtering to a reference voltage that is associated with an electrical current that is associated with the fully functioning electronic switch; and an evaluation device coupled with the comparator and configured to detect a defect of the electronic switch based on the result of the comparison implemented with the comparator.

2. The electrical device of claim 1, wherein the filtered secondary-side electrical voltage is generated by filtering the secondary-side voltage to a reference voltage that is associated with a rate of change of the electrical current associated with the fully functioning electronic switch.

3. The electrical device of claim 1, wherein at least one of:
the electronic switch is a semi-conductor switch and the electronic switching element is designed as a transistor;
the electrical load is an inductive load; or
the power unit is designed as an H-bridge.

4. The electrical device of claim 1, wherein the electronic switching element is part of the current path through which the electrical current associated to the electronic switching element flows during operation of the power supply.

5. The electrical device of claim 1, wherein the evaluation device is configured to detect a defect of the electronic switch based on the comparison implemented with the comparator for a power-on or power-off process of the electrical switching element.

6. The electrical device of claim 1, wherein the secondary-side electrical voltage is at least approximately determined according to the following equation:

$$U2 = n2/n1 * L1 * di/dt$$

wherein:
U2 is the secondary-side electrical voltage;
n1 is the number of windings of the primary-side winding;
n2 is the number of windings of the secondary-side winding;
L1 is the primary-side inductance of the primary-side winding, and
di/dt is the rate of change of the electrical current associated to the electronic switching element.

7. The electrical device of claim 1, wherein the comparator generates an output signal that changes as soon as the secondary-side electrical voltage or the filtered secondary-side electrical voltage exceeds the reference voltage.

8. The electrical device of claim 1, wherein the evaluation device is configured to determine a defect of the electronic switch when, despite of a power-on or power-off process of the electronic switching element, the secondary-side electrical voltage or the filtered secondary-side electrical voltage is always lower than the reference voltage.

9. The electrical device of claim 1, further comprising a low-pass filter coupled downstream from the pulse transformer and configured to generate the filtered secondary-side electrical voltage from the secondary-side electrical voltage.

10. A method for monitoring a power supply of an electrical device according to claim 1, the method comprising:
alternately opening and closing the electronic switching element;
comparing the secondary-side electrical voltage or the filtered secondary-side electrical voltage with the reference voltage; and
determining a defect of the electronic switch based on the comparison.

11. The method of claim 10, wherein a potential defect of the electronic switch based on the comparison is determined when, despite a power-on or power-off process of the electronic switching element, the secondary-side electrical voltage or the filtered secondary-side electrical voltage is always lower than the reference voltage.

* * * * *